United States Patent
Kokubun et al.

(10) Patent No.: US 6,523,257 B1
(45) Date of Patent: Feb. 25, 2003

(54) METHOD FOR FORMING FINE THROUGH HOLE CONDUCTION PORTION OF CIRCUIT BOARD

(75) Inventors: Katsunori Kokubun, Kashima-gun (JP); Kunihiko Azeyanagi, Kashima (JP); Toshiyuki Tsukahara, Ushiku (JP)

(73) Assignee: Nippon Mektron, Ltd., Tokyo (JP)

( * ) Notice: Subject to any disclaimer, the term of this patent is extended or adjusted under 35 U.S.C. 154(b) by 53 days.

(21) Appl. No.: 09/786,017

(22) PCT Filed: Jun. 27, 2000

(86) PCT No.: PCT/JP00/04198
§ 371 (c)(1),
(2), (4) Date: Feb. 28, 2001

(30) Foreign Application Priority Data

Jul. 2, 1999 (JP) ............................................ 11-188547

(51) Int. Cl.⁷ ................................................. H01K 3/10
(52) U.S. Cl. .............................. 29/852; 29/846; 29/831; 205/125
(58) Field of Search ......................... 29/852, 846, 831; 205/125; 219/121.7, 121.71

(56) References Cited

U.S. PATENT DOCUMENTS

| | | | | |
|---|---|---|---|---|
| 5,347,712 A | | 9/1994 | Yasuda et al. ................. 28/852 |
| 5,378,869 A | * | 1/1995 | Marrs et al. ............ 219/121.71 |
| 5,548,099 A | * | 8/1996 | Cole et al. .............. 219/121.69 |
| 5,558,928 A | * | 9/1996 | DiStefano et al. ........... 174/258 |
| 5,614,114 A | * | 3/1997 | Owen ...................... 219/121.66 |
| 5,640,761 A | * | 6/1997 | DiStefano et al. ........... 174/262 |
| 5,841,099 A | * | 11/1998 | Owen et al. ............ 219/121.69 |
| 5,953,029 A | * | 9/1999 | Keefe et al. .................... 347/65 |
| 6,192,581 B1 | * | 2/2001 | Tsukamoto .................... 29/830 |
| 6,282,782 B1 | * | 9/2001 | Biunno et al. ................ 174/264 |
| 6,303,881 B1 | * | 10/2001 | Parker et al. ................ 174/256 |
| 6,320,140 B1 | * | 11/2001 | Enomoto ..................... 174/255 |

OTHER PUBLICATIONS

Japanese Search Report, No. PCT/JP00/04198—3 pages.

* cited by examiner

*Primary Examiner*—Joseph J. Hail, III
*Assistant Examiner*—Alvin J. Grant
(74) *Attorney, Agent, or Firm*—Alix, Yale & Ristas, LLP

(57) ABSTRACT

In order to realize through hole conduction of an internal layer wiring pattern 4 and respective external layer conduction layers 2 and 5 on both sides, a through hole partially blocked is formed to the internal layer wiring pattern 4 from one external layer conduction layer 2 by laser means. Similarly, another through hole which is partially blocked and displaced from the former hole within an allowable range is formed to the internal layer wiring pattern 4 from the other external layer conduction layer 5 by the laser means, thereby forming a stepped through hole 6. At last, a through hole coating layer 7 is formed.

4 Claims, 2 Drawing Sheets

METHOD FOR FORMING FINE THROUGH HOLE CONDUCTION PORTION OF CIRCUIT BOARD

CROSS-REFERENCE TO RELATED APPLICATION

This is the U.S. national phase of International Application No. PCT/JP00/04198 filed Jun. 27, 2000.

TECHNICAL FIELD

The present invention relates to a method for forming a fine through hole conduction portion of a circuit board by which a fine through hole can be assuredly formed to a flexible circuit board and the like requiring the high-density wiring.

BACKGROUND ART

As means for mutually conducting wiring patterns on both sides of a circuit board, it is common to form a through hole at a required position by a drill and the like and then perform through hole plating on the inner surface of the through hole.

Here, in order to form a wiring pattern with a higher density, it is advantageous to form a diameter of the through hole as small as possible. However, in case of the perforating process using the drill means, formation of a hole having a diameter of approximately 0.4 mm is the limit, which will be an obstacle when the high-density wiring is desired.

Further, in case of a multilayer circuit board, conduction between an internal layer wiring pattern and an external layer wiring pattern is also generally achieved by the through hole coating, but electrical connection of the internal layer wiring pattern is intended only by plating on the internal wall. With this structure, a contact area between the through hole coating and the internal layer wiring pattern is not very large, and a crack caused due to thermal expansion is hence apt to be generated. Therefore, it is hard to say that the reliability of connection conduction is excellent. Further, in the multilayer circuit board, as a technique for mutually conducting the external layer wiring pattern and the internal layer wiring pattern, there is disclosed a technique for forming a through hole by laser irradiating means through a mask to which a through hole is provided in, for example, Japanese Patent Application Laid-Open No. 78171/1974. The hole connected for conduction by such a technique is known as an SVH, i.e., a blind through hole or simply referred to as a via hole. Since this technique uses chemical resin etching means or laser means, fine hole processing is possible, but a through hole which pierces the circuit board is not obtained.

It is, therefore, an object of the present invention is to provide a method for forming a fine through hole of a circuit board, which can also preferably cope with a fine wiring pattern while preferably improving the connection reliability for conduction by quickly minifying mutual conduction of an internal layer wiring pattern and an external layer wiring pattern in a stepped structure in case of a multilayer circuit board.

DISCLOSURE OF THE INVENTION

To achieve this aim, a method for forming a fine through hole conduction portion of a circuit board according to the present invention is characterized in that, in order to realize through hole conduction between an internal layer wiring pattern and each external layer conduction layer on both sides, a through hole which is partially blocked is formed to said internal layer wiring pattern from one external layer conduction layer by laser means; another through hole which is also partially blocked and displaced from said through hole in an allowable range is formed to said internal layer wiring pattern from the other external layer conduction layer by said laser means to form a stepped through hole; and thereafter through hole plating is carried out.

Here, a pattern shape at a position where the through hole conduction is to be made in the internal layer wiring pattern is formed to be larger than a shape of a conduction layer removing hole formed to the both external layer conduction layers. Further, in the internal layer wiring pattern of the through hole conduction portion, a conduction layer such as a copper foil should be removed to be half the size of the shape of the internal layer wiring pattern. Moreover, both the regular electroless plating means and the electrolytic plating means can be used for the through hole plating processing.

According to such a through hole structure having the overlapping stepped form, since the contact area of the internal layer wiring pattern and the through hole coating can be preferably enlarged, the reliability of the electrical connection between the internal wiring pattern and the both external layer conduction layers can be greatly increased even with the fine through hole conduction structure, thereby obtaining the circuit board for the multilayer high-density wiring.

BEST MODE FOR CARRYING OUT THE INVENTION

Figure 1:
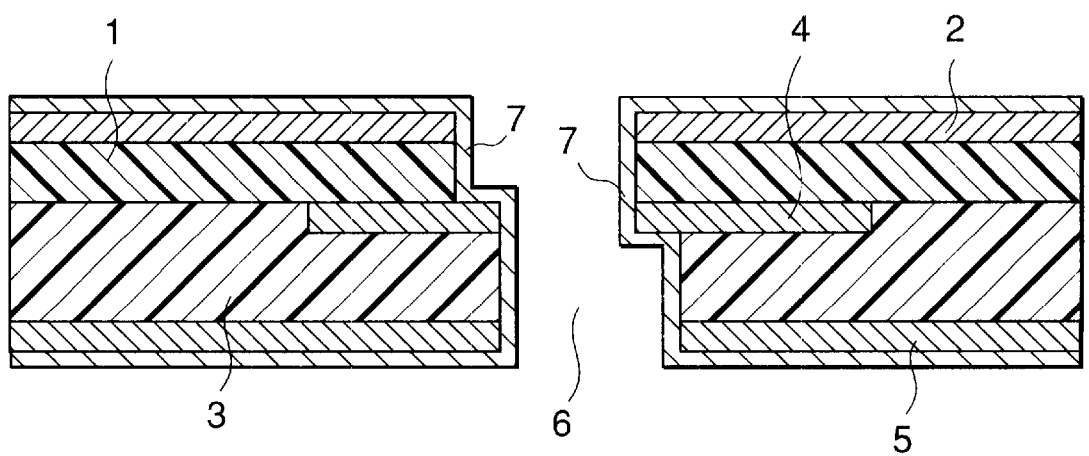
FIG. 1 is a conceptual cross-sectional view showing a through hole conduction portion obtained by adopting a method for forming a fine through hole conduction portion of a circuit board according to the present invention.
Figure 2:
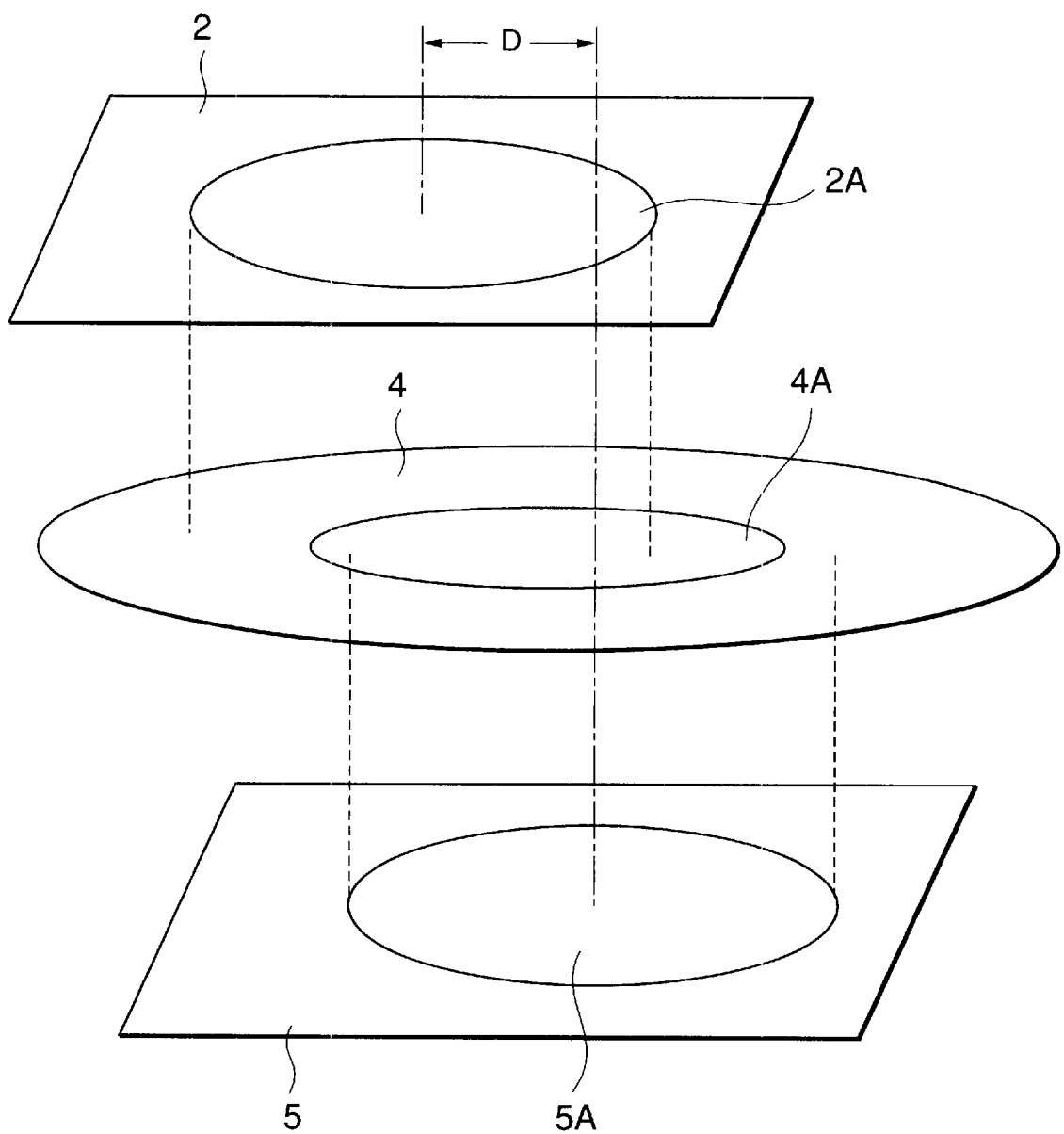
FIG. 2 is a view for explaining the mutual arrangement relationship between an internal layer wiring pattern and each hole provided to both external layer conduction layers.

The present invention will now be described in detail based on an illustrative embodiment. FIG. 1 is a conceptual cross-sectional view showing a through hole conduction portion obtained by adopting a method for forming a fine through hole conduction portion of a circuit board according to the present invention, and FIG. 2 is a view for explaining the mutual arrangement relationship between an internal layer wiring pattern and each hole provided to both external layer conduction layers.

In FIG. 1, reference numeral 1 denotes a first insulating layer. One external layer conduction layer 2 consisting of a copper foil and the like is provided on the top surface of the first insulating layer 1. Further, another external layer conduction layer 5 which also consists of a copper foil and the like is provided on the external surface of a second insulating layer 3. For example, a land-shaped internal layer wiring pattern 4 is formed inside the both insulating layers 1 and 3 to constitute a circuit board having a so-called three-layer structure.

A through hole 6 having a stepped cross section as shown in the drawing is formed between the respective external layer conduction layers 2 and 5 and the internal layer wiring pattern 4, and a through hole coating layer 7 is implemented in order realize through hole conduction to the respective external layer conduction layers 2 and 5 and the internal layer wiring pattern 4 including the inner surface of the stepped through hole 6 in the usual manner by using both electroless plating means and electrolytic plating means.

Since the through hole 6 is formed in the stepped shape, a contact surface of the through hole coating layer 7 with the internal layer wiring pattern 4 is enlarged as shown in the drawing, and the reliability of electrical connection between the external layer conduction layers 2 and 5 on the both sides can be excellently assured.

In order to form the stepped through hole 6, for example, a through hole having a hole diameter of approximately 0.1 mm is formed from one external layer conduction layer 2 by laser irradiating means using, e.g., excimer laser, carbon dioxide laser or YAG laser, and another through hole having a diameter of approximately 0.1 mm is also formed from the other external conduction layer 5 at a position distanced away from the position of the former through hole by approximately 0.05 mm by the laser irradiating means. The plating liquid can sufficiently penetrate the fine stepped through hole 6, which effectively contributes to realization of the high density of a wiring pattern by the fine through hole 6.

Moreover, as the first and second oth nsulating layers 1 and 3, a glass epoxy resin or polyimide resin film which is used for a regular circuit board can be employed. Since the stepped through hole 6 is formed by the laser irradiating means as described above, conduction layer removing portion holes 2A and 5A corresponding to the diameter of the above holes are provided to predetermined positions of the respective external layer conduction layers 2 and 5 on the both sides in advance. Incidentally, upon forming the stepped through hole 6, it is preferable to perform the process for dipping in a permanganic acid liquid as means for removing residues in the hole in order to obtain an excellent coating layer.

FIG. 2 is a view showing the mutual arrangement relationship of the internal layer wiring pattern 4 and the respective holes 2A and 5A provided to the both external layer conduction layers 2 and 5. Giving description on a key point for manufacturing a circuit board by the technique according to the present invention with reference to this drawing, a single-sided copper-clad laminate having a copper foil with the thickness of 18 $\mu$m, an adhesive layer with the thickness of 18 $\mu$m and a polyimide resin film as an insulating layer with the thickness of 25 $\mu$m was prepared in order to form the internal layer wiring pattern 4, and the land-shaped internal layer wiring pattern 4 was then formed together with necessary wiring patterns in the usual manner. At this time, a hole 4A is simultaneously formed in the central portion of the land-shaped internal layer wiring portion 4. In this case, it was determined that the external diameter of the land-shaped internal layer wiring pattern 4 was 0.300 mm and the internal diameter of the hole 4A was 0.120 mm.

Each single-sided copper-clad laminate having the copper foil with the thickness of 18 $\mu$m, the adhesive layer with the thickness of 18 $\mu$m and the polyimide resin film as the insulating layer with the thickness of 25 $\mu$m is laminated through a polyimide film with an adhesive having the total thickness of 50 $\mu$m and a polyester-based interlayer adhesive having the thickness of 50 $\mu$m on the both sides of the circuit board to which the internal layer wiring pattern 4 is formed.

Subsequently, each copper foil etching removing portion is formed in such a manner that the internal diameter of the respective holes 2A and 5A becomes 0.150 mm with respect to one external layer conduction layer 2 and thee other external layer conduction layer 5. In this case, h both holes 2A and 5A are formed so that their positions are displaced from each other by 0.050 mm in the center as indicated by reference numeral D. In this manner, the size of the hole 4A of the land-shaped internal layer wiring pattern 4 is approximately 80% of the size of the respective holes 2A and 5A formed to the both external layer conduction layers 2 and 5. At this stage, the carbon dioxide laser having an output of 2.0 W and a frequency of 300 Hz is used to carry out three-shot irradiation from one external layer conduction layer 2 side at first. Thereafter, three-shot irradiation is effected from the other external layer conduction layer 5 side, thereby obtaining the stepped through hole 6 as shown in FIG. 1.

At last, the above-described process for dipping into a permanganic acid liquid is performed to clarify the inside of the through hole 6, and the electroless copper plating process and the electrolytic copper plating process are-conducted in the usual manner to form the through hole coating layer 7.

Subsequently, by carrying out the wiring patterning process with respect to the both external layer conduction layer 5 by adopting the regular technique, a required circuit board can be obtained.

Industrial Applicability

According to the method for forming the through hole conduction portion of a circuit board of the present invention, since the through hole is formed in the stepped shape, a contact area of the through hole coating layer with the internal layer wiring pattern is enlarged, which can excellently assure the reliability of electrical connection between the internal layer wiring pattern and the external layer conduction layers on the both sides.

Therefore, when manufacturing a fine circuit board with high density, adoption of the present invention is extremely advantageous.

What is claimed is:

1. A method for forming a fine conductive through hole in a circuit board in order to realize through hole conduction between an internal layer wiring pattern and respective external conduction layers on both sides of the circuit board, comprising the steps of:

forming by laser means from one external conduction layer a first through hole partially blocked by the internal wiring pattern;

forming a second through hole by laser means from the other external conduction layer, said second hole being partially blocked by the internal layer wiring pattern and offset from said first through hole; and plating the first and second through holes to provide a conductive layer between the internal layer wiring pattern and the external conduction layers.

2. The method for forming a fine conductive through hole in a circuit board according to claim 1, wherein the formed conductive through hole in said internal layer wiring pattern is of a smaller dimension than the dimensions of the first and second holes formed in both the external conduction layers.

3. The method for forming a fine conductive through hole in a circuit board according to claim 2, wherein a conductive through hole portion formed in the internal layer wiring pattern is half the size of the first and second through holes formed in the external conduction layers.

4. The method for forming a fine conductive through hole in a circuit board according to claim 1, wherein the step of plating is carried out by both electroless plating means and electrolytic plating means.

\* \* \* \* \*